United States Patent [19]

Umeda et al.

[11] 4,369,513

[45] Jan. 18, 1983

[54] SEMICONDUCTOR LASER DEVICE

[75] Inventors: Jun-ichi Umeda; Takashi Kajimura, both of Hachioji, Japan

[73] Assignee: Hitachi, Ltd., Tokyo, Japan

[21] Appl. No.: 204,012

[22] Filed: Oct. 31, 1980

[30] Foreign Application Priority Data

Nov. 9, 1979 [JP] Japan .................................. 54-144402
Oct. 8, 1980 [JP] Japan .......................... 55-142704[U]

[51] Int. Cl.³ ............................................. H01S 3/19
[52] U.S. Cl. ....................................... 372/46; 357/17; 372/50
[58] Field of Search .................... 331/94.5 H; 372/46, 372/50; 357/17

[56] References Cited

U.S. PATENT DOCUMENTS 4,219,785  8/1980  Scifres et al. ................. 331/94.5 H
4,251,780  2/1981  Scifres et al. ................. 331/94.5 H

FOREIGN PATENT DOCUMENTS 10949  5/1980  European Pat. Off. ....... 331/94.5 H

OTHER PUBLICATIONS

Ikegami et al, "Planar Stripe with Waist/Notch (SWAN) Injection Laser", *Electronics Letters*, Nov. 23, 1978, vol. 14, No. 24, pp. 753-754.
de Waard, "A Novel Single Mode Laser Having Periodic Variations in the Stripe Width (Super DFB), *Conference Proceedings of the Optical Communication Conference*", Amsterdam, Netherlands, 17-19 Sep. 1979, pp. 18.4-1-18.4-3.
Appl. Phys. Lett. 33(12), Dec. 15, 1978, pp. 1015-1017.
RCA Technical Notes, RCA TN No. 760, Apr. 1968.

*Primary Examiner*—James W. Davie
*Attorney, Agent, or Firm*—Kenyon & Kenyon

[57] ABSTRACT

Disclosed is a semiconductor laser element having on a predetermined semiconductor substrate a stacked region for optical confinement including an active layer and clad layers, a first electrode disposed on the semiconductor substrate side and a second electrode disposed over the stacked region, and means for constructing an optical resonator, the semiconductor laser element comprising the fact that the means to inject current into the active layer is formed of a plurality of stripe conductive regions which are juxtaposed in traveling direction of a laser beam, and that laser radiations emitted in correspondence with the respective stripe conductive regions form a simply connected net and give rise to nonlinear interactions among them. As a typical example of the current injection means, the conductive regions have a strip-shaped pattern which includes a broader portion and a narrower portion. A coupled-multiple-stripe laser element in which the phases and wavelengths of the laser radiations of the respective strips are uniform is realized.

6 Claims, 16 Drawing Figures

SEMICONDUCTOR LASER DEVICE

BACKGROUND OF THE INVENTION

1. Field of the Invention

This invention relates to a semiconductor laser device, and more particularly to a coupled-multiple-stripe semiconductor laser device which can produce a laser beam of high power.

2. Description of the Prior Art

Recently, semiconductor lasers including double heterostructures have become capable of continuous oscillations at the room temperature. A typical double heterostructure is constructed of n-type (GaAlAs/p-type GaAs/p-type GaAlAs.

The general construction of the semiconductor laser device of this type is as follows. On a p-GaAs (100) wafer substrate, there are successively stacked the compound semiconductor layers of a buffer layer (also termed "clad layer") of p-GaAlAs which is formed by the liquid epitaxial growth, an active layer of GaAs (or GaAlAs) which is formed on the buffer layer, and a clad layer of n-GaAlAs which is formed on the active layer. Further, an upper evaporated metal electrode is formed through an SiO$_2$ coating film having a strip-shaped opening, while a lower evaporated metal electrode is formed on the rear surface of the substrate. Thus, the semiconductor laser element having the stripe-geometry electrode is constructed.

In the semiconductor laser of this type, it has been proposed to increase the optical output of the whole device by juxtaposing a plurality of stripe light-emitting portions. An example is described in 'Appl. Phys. Lett.', vol. 34, No. 2, 15 January 1979, pp 162–165. In actuality, however, the respective stripes differ in the mode, wavelength and phase of laser radiation, and a laser beam of a quality high enough to be used for optical communication or in an optical disk memory, a laser beam printer etc. has not been obtained yet.

In this regard, when the intervals of the stripe electrodes are narrowed, the spreading width of current becomes greater than the light distribution width of a resonant laser beam (a laser beam oscillatingly reciprocating between both the optically flat faces of the crystal). Therefore, the current distribution becomes uniform before the light distribution does, and eventually the stripe electrodes act like a single electrode plate. In such case, the resonant laser beam gives rise to a filamentary oscillation irrespective of the stripe geometry, resulting in the disadvantage that light is emitted in the form of spots at random to drastically degrade the quality of the laser beam.

SUMMARY OF THE INVENTION

An object of this invention is to provide, in a coupled-multiple-stripe laser, a semiconductor laser device in which the phases of the laser radiations of respective stripes are uniform and which accordingly delivers high power as its total output.

A further object of this invention is to provide a high-power semiconductor laser device in which the laser wavelengths of the respective stripes are uniform.

In order to accomplish the objects, this invention adopts a structure as stated below. In a semiconductor laser device of the multiple-stripe double heterostructure type, a plurality of stripe electrically-conductive regions each including a broader portion and a narrower portion are disposed over a layer on at least one side of an active layer, to form a simply connected net in which the laser radiations of the respectively adjacent ones of a plurality of active regions developing in the active layer intersect in substance.

The stripe conductive regions are formed in a manner to be apparently isolated from the adjoining stripe conductive regions. In lasing, however, a resonant laser beam oscillating in each active region appears with a light distribution broader than the stripe width of the conductive region. Accordingly, the resonant laser beam touches or connects with the light emission of the adjoining other stripe in the broader portions which oppose with a narrow spacing therebetween, and the light distributions overlap each other in the connecting part (hereinbelow, this part shall be briefly termed "overlapping region"). Further, in the broader portions of the stripe conductive regions, a sufficient current flows (accordingly, a gain develops) also in the overlapping region of the light distributions, and an optical interaction takes place. Owing to the fact that the nonlinear interaction (saturable gain or absorption exists in the overlapping region of the light emissions in this manner, the laser oscillations of the respective stripes are held in the relationship of equal wavelengths and fixed phases. On the other hand, the narrow portions of the stripe conductive regions control the centers of the respective light distributions.

DETAILED DESCRIPTION OF THE INVENTION

Hereunder, the invention will be described in detail in conjunction with embodiments.

Figure 1:
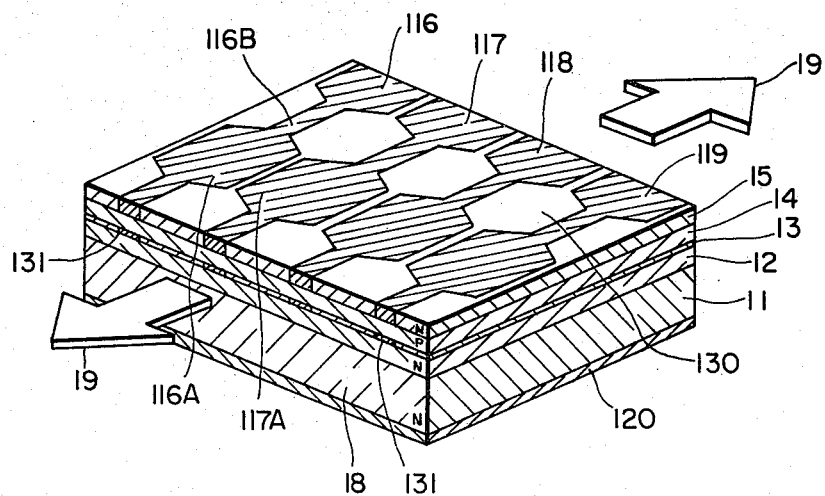
FIG. 1 is a schematic perspective view of a semiconductor laser element which is an embodiment of this invention.

FIG. 1 is a schematic perspective view of a typical embodiment of this invention.

This semiconductor laser element is such that a crystal of the conventional double heterostructure laser is formed with stripe electrically-conductive regions 116–119 each of which has parts of unequal stripe widths in the direction of laser oscillation.

An active layer and clad layers may be set as in the conventional double heterostructure type semiconductor laser device.

The widths of the broader regions, for example, 116A and 117A of the stripe conductive regions 116 and 117 are often made less than the size of the ordinary filamentary light emission or less than approximately 15 μm. Even when the broader portions are made very broad, a single filamentary oscillation occurs within the active layer, and a satisfactory effect is not achieved. On the other hand, the narrower region of the stripe electrode region (hereinbelow, briefly termed "narrower portion") is often made approximately 10 μm or less. With the present-day technology, such portions can be readily formed down to a narrowness of approximately 1 μm. Regarding the proportions of the broader portions and the narrower portions with respect to the length of the stripe electrode, it is common practice to set ¼-¾ of a cavity length as the proportion of the broader portions. In many cases, approximately ⅜-⅝ are set as the proportion of the broader portions.

When the proportion of the broader portions to the narrower portions in the stripe electrode is less than ¼, the optical interaction between the light emitting regions of the respective stripes is insufficient. When it exceeds ¾, the filament phenomenon becomes prone to occur in the end.

As a standard, the widths of the broader portion and the narrower portion are set as follows. The broader portion needs to protrude at least 20% of the interval between the narrow portions. It should be at most 80%. In case where the broader portions confront each other as shown in FIG. 1, the sum of the protruding parts of the broader portions may agree with the proportion specified above. A protrusion below 20% results in an insufficient optical interaction between the stripe conductive regions, while a protrusion above 80% results in liability to the filament phenomenon. In ordinary semiconductor laser devices, when the width of an electrode strip exceeds 15 $\mu$m, the filamentary oscillation is generated by the single strip. After all, the broader portion ought to be at most 15 $\mu$m wide and is designed so as to protrude within a range of 3–12 $\mu$m beyond the narrower portion.

Although the stripe conductive regions are exemplified in a reduced number in FIG. 1, they are, in general, formed in a number of 10–30 or so. It is requisite that the smallest spacing of the adjoining stripe conductive regions does not exceed the width of the broader portion of the stripe conductive region.

In this example, the broader portion 116A and narrower portion 116B of the stripe 116 are formed to be 8 $\mu$m and 3 $\mu$m wide respectively and to be 100 $\mu$m long. The pitch of the stripes is made 10–20 $\mu$m.

On account of the current spreading, the light distribution width during the oscillation of the laser element extends up to approximately 8 $\mu$m substantially equal to the width of the broader portion in terms of the halfwidth. Accordingly, the laser element is obtained in which the stripes adjoining each other in the foot parts of their light distributions are coupled through the overlapping region of approximately 6 $\mu$m.

In this manner, even when the adjoining stripes have the spacing therebetween, the light distributions overlap each other between the broader portions of the stripe conductive regions, and the nonlinear interaction takes place, so that the laser oscillations of the respective stripes are held in the relationship of equal wavelengths and fixed phases.

Hereunder, the concrete construction of this laser element will be described.

On an n-GaAs (100) crystal substrate 11 doped with silicon (Si) and having a carrier concentration (hereinbelow, denoted by $C_c$) of $2 \times 10^{17}$ cm$^{-3}$, there are successively formed by the well-known liquid epitaxial growth a clad layer of n-Ga$_{0.7}$Al$_{0.3}$As 12 being 1.5 $\mu$m thick, doped with tellurium (Te) and having $C_c \approx 2 \times 10^{18}$ cm$^{-3}$, an active layer of n-GaAs 13 being 0.1 $\mu$m thick, doped with tellurium (Te) and having $C_c \approx 1 \times 10^{18}$ cm$^{-3}$, a clad layer of p-Ga$_{0.7}$Al$_{0.3}$As 14 being 1.5 $\mu$m thick and having $C_c \approx 1 \times 10^{18}$ cm$^{-3}$, and a cap layer of n-GaAs 15. Subsequently, a mask of an SiO$_2$ film having stripe openings in a predetermined pattern is formed on the cap layer 15, and the n-GaAs layer is subjected to the selective diffusion of, for example, zinc (Zn). Then, a plurality of stripe conductive regions (116, 117, 118, 119 etc.) made of a p-GaAs layer are formed. The number of the stripe openings was 20. The mask for the selective diffusion is removed, and an SiO$_2$ film having a thickness of 5,000 Å is formed anew. Using the conventional photolithography, this SiO$_2$ film is provided with openings similar to the stripe conductive regions stated above. Subsequently, chromium (Cr) and gold (Au) are evaporated on the whole front surface so as to form a p-side electrode. The p-side electrode portion is omitted from the illustration in order to clarify the configuration of the stripe conductive regions. After polishing and lightly etching the rear surface of the semiconductor substrate 11, a gold (Au)-germanium (Ge) alloy is evaporated to form an n-side electrode 120. The resonator length is 300 $\mu$m.

Lastly, crystal faces are cleaved in planes perpendicular to the traveling direction of a laser beam so as to construct an optical resonator.

The laser is oscillated by connecting the p-side electrode to the positive pole of a power source and the n-side electrode to the negative pole thereof. The optical interaction between laser radiations corresponding to the respective stripes is effected by the broader portions of the respective stripes.

With the laser element of this embodiment, when the number of the stripes was 20 and the forward current was 16 A (threshold current: 1A), a laser beam of high quality was obtained whose power was 3.2 W to one face, which exhibited a single wavelength (880 nm) and an identical phase and whose spreading angle was not wider than 0.5° within a plane parallel to the junction.

Figure 2:
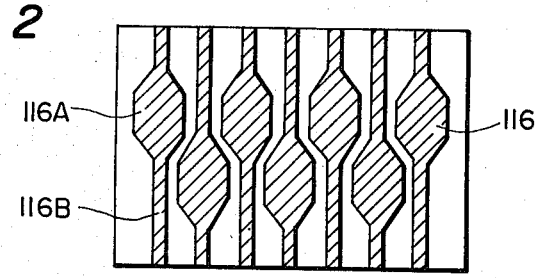
FIGS. 2 to 4 and FIGS. 8 to 11 are schematic plan views of stripe nets of semiconductor laser elements.

FIG. 2 is a schematic plan view of the configuration of stripe conductive regions as another embodiment of this invention.

As illustrated in the figure, the broader portion 116A of the stripe 116 is opposed to the narrower portion of another stripe. Needless to say, the spacing of the proximity between the respective stripes is set as described before. In this stripe configuration, the interspace between the stripes is made smaller, which is advantageous for raising the integration density of the laser element.

Figure 3:
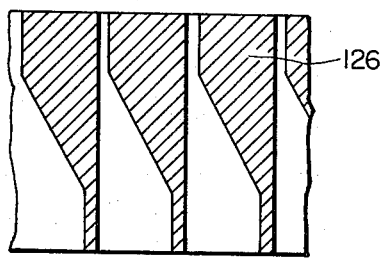
Figure 4:
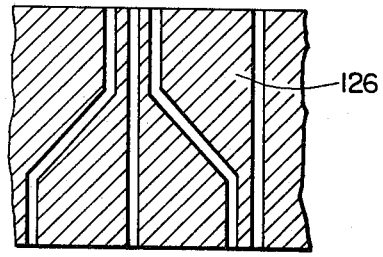

FIGS. 3 and 4 are schematic plan views of improved stripe patterns as further embodiments of this invention.

These examples differ from the examples thus far described in that the shapes of the individual stripes are bilaterally asymmetric and that the broader portions are hook-shaped. Also in this case, the optical interaction is effected by the broader portions, and the center of the light distribution is controlled by the narrower portion. Although one stripe itself may well present an asymmetric shape, it is preferable that the stripe pattern holds a geometric symmetry as the whole laser element. This is important for bringing laser radiations developing in the respective strips into an identical phase.

In forming the stripe conductive regions according to this invention, there can be employed means for the formation other than that in the foregoing concrete example, such as a metal electrode in a predetermined configuration.

Figure 5:
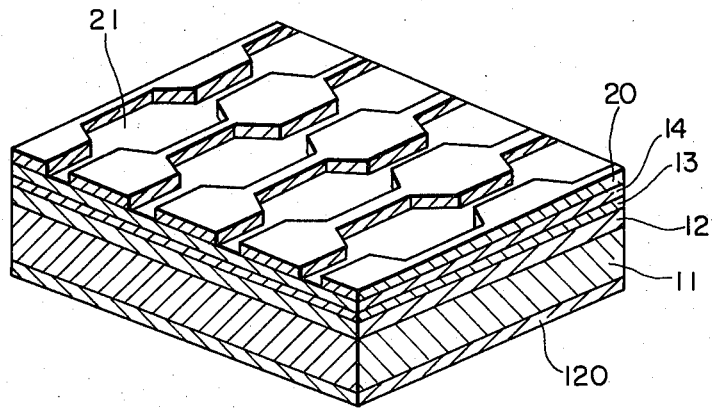
FIGS. 5 and 6 are perspective views showing another embodiment.
Figure 6:
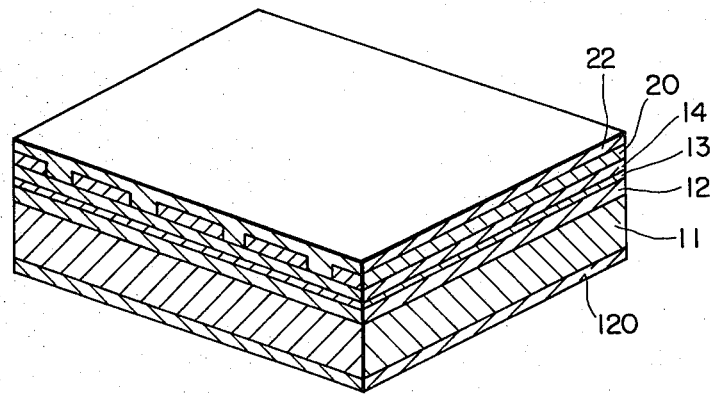
Figures 7A, 7B, 7C:
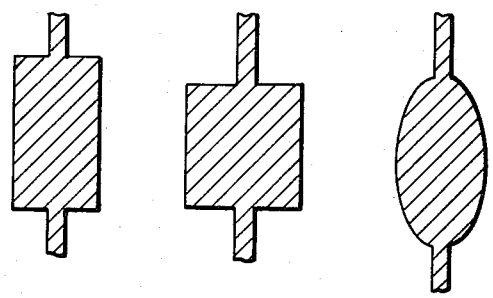
FIGS. 7a to 7e are plan views each showing an example of the shape of a broader portion.
Figures 7D, 7E:
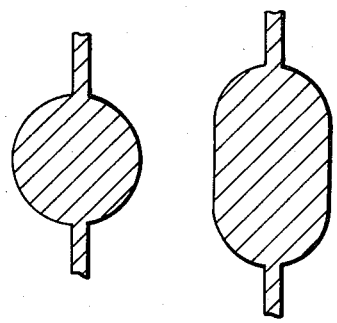

FIGS. 5 and 6 show an example employing a metal electrode. Likewise to the example illustrated in FIG. 1, using the liquid epitaxial growth, an n-GaAs substrate 11 is successively overlaid with an n-Ga$_{0.7}$Al$_{0.3}$As layer 12 which is 1.5 $\mu$m thick, a non-doped GaAs layer 13 which is 0.1 $\mu$m thick and a p-Ga$_{0.7}$Al$_{0.3}$As layer 14 which is 1.5 $\mu$m thick. Subsequently, an SiO$_2$ film 20 is formed to a thickness of 5,000 Å by the conventional CVD (chemical vapor deposition) process. Stripe openings 21 in a predetermined configuration are formed by the conventional photolithography. This state corresponds to FIG. 5. In some cases, a semiconductor layer is further disposed as a buffer layer on the p-$Ga_{0.7}Al_{0.3}As$ layer 14.

At the next step, Cr and Au are successively evaporated on the prepared semiconductor substrate, to form a metal layer 22 (refer to FIG. 6). With this structure, an effect equivalent to that previously described can be achieved.

Although the semiconductor laser element of the GaAsAl-GaAs-based double heterostructure has been referred to in the present embodiment, it is needless to say that the invention is not restricted to the example but that it is also applicable to lasers which include ternary compound semiconductors such as GaAlP, InGaP, GaAsP and GaAsSb or quaternary compound semiconductors such as InGaAsP, GaAlAsSb and GaAlAsP. In addition, it goes without saying that this invention is applicable to other sorts of semiconductor laser devices with the carrier confinement ameliorated as typified by a buried heterostructure.

It is a matter of course that the concrete shape of the broader portion is not restricted to those shown in FIGS. 1 to 5. Various modifications will now be described.

The broader portion may well be in the shape of an oblong, square, ellipse, circle, a device in which they are combined, or the like. FIGS. 7a-7e show several examples.

When the broader portion is oblong, the length of a side over which the optical interaction is executed increases, and the optical interaction becomes efficient. Accordingly, the area can be effectively utilized. The same applies to the square broader portion.

When the broader portion is in the shape of a circle or in a shape similar thereto, an abrupt bend is not included, so that the loss of a laser beam lessens.

Figure 8:
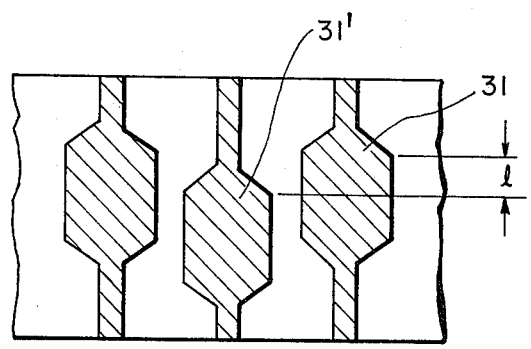
Figure 9:
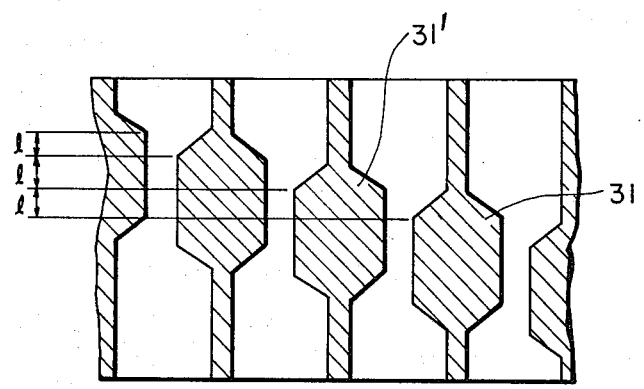

In each of modifications in FIGS. 8 and 9, a broader portion 31 is opposed to a broader portion 31' of another strip pattern with a shift of a distance l therebetween.

Figure 10:
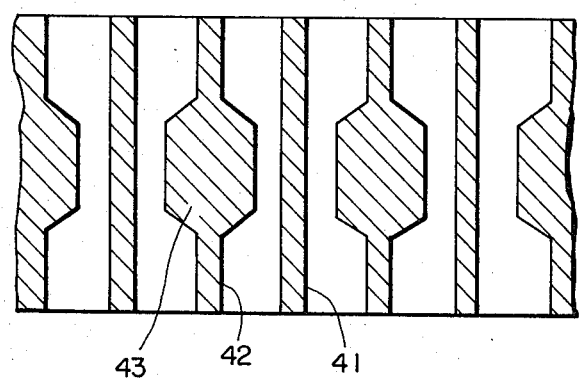

In a modified embodiment of FIG. 10, a strip pattern 42 having a broader portion 43 and a mere strip 41 are opposed. Needless to say, the spacing of the proximity between the respective strips is set as described before.

Such arrayal of the strips is advantageous for enhancing the density of integration of the laser.

Figure 11:
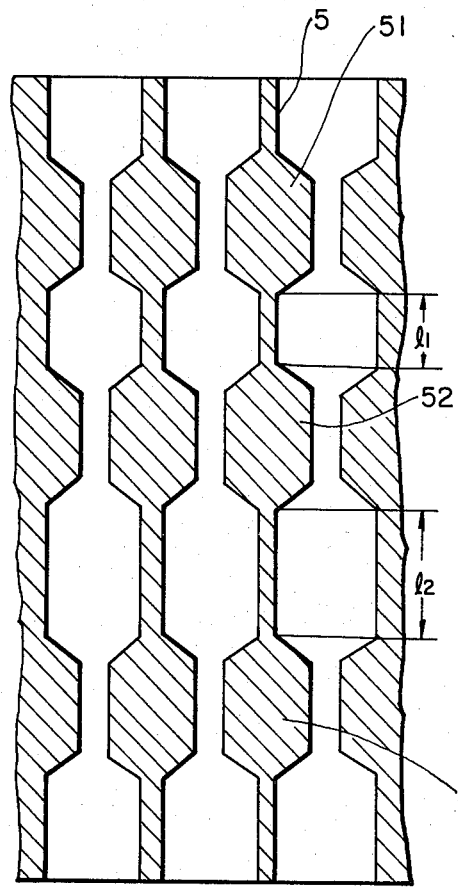

In a modified embodiment of FIG. 11, broader portions 51, 52 and 53 which a strip 5 has are not arranged at equal intervals, but are arranged at intervals $l_1$ and $l_2$ different from each other. Such pattern of the strips is advantageous for adjusting the phases of laser radiations.

Figure 12:
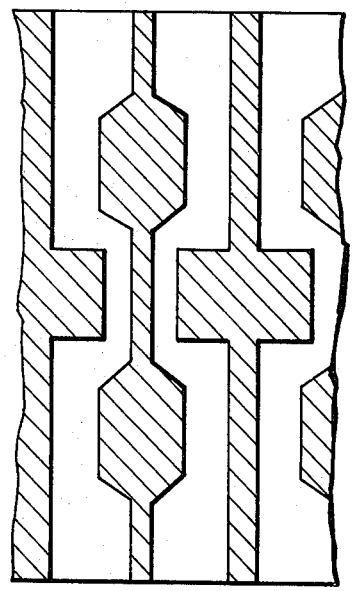

Even when the shapes of respective broader portions are different, this invention can be performed. FIG. 12 shows such an example.

What is claimed is:

1. In a semiconductor laser device having on a predetermined semiconductor substrate a stack region for optical confinement including at least an active layer and a clad layer, a first electrode disposed on the semiconductor substrate side, a second electrode disposed over the stack region for injecting current into the active layer, and means comprising an optical resonator, the improvement comprising: the second electrode being a plurality of stripe conductive regions at least one of which includes a broader portion and a narrower portion juxtaposed in the traveling direction of a laser beam whereby the laser radiation emitted in correspondence with the respective stripe conductive regions will form a simply connected net and give rise to nonlinear interactions of the plurality of active regions which will thereby develop in the active layer.

2. A semiconductor laser device as defined in claim 1, wherein adjacent stripe conductive regions have a minimum spacing which is not greater than the width of said broader portion.

3. A semiconductor laser device as defined in claim 1, wherein each of said plurality of stripe conductive regions includes a broader portion and a narrower portion.

4. A semiconductor laser device as defined in claim 3, wherein the adjacent stripe conductive regions have a minimum spacing which is not greater than a width of said broader portion.

5. A semiconductor laser device as defined in any of claims 1 to 4 wherein the broader portions of said stripe conductive regions lie adjacent each other.

6. A semiconductor laser device as defined in any of claims 1 to 4 wherein the broader portions of said stripe conductive regions are disposed adjacent narrower portions of stripes disposed adjacent thereto.

* * * * *